(12) United States Patent
Kim et al.

(10) Patent No.: US 7,187,609 B2
(45) Date of Patent: Mar. 6, 2007

(54) SELF REFRESH CIRCUIT OF PSRAM FOR REAL ACCESS TIME MEASUREMENT AND OPERATING METHOD FOR THE SAME

(75) Inventors: Soo-Young Kim, Hwaseong-si (KR); Hyun Seok Lee, Seoul (KR)

(73) Assignee: Samsung Electronics, Co., Ltd. (KR)

( * ) Notice: Subject to any disclaimer, the term of this patent is extended or adjusted under 35 U.S.C. 154(b) by 0 days.

(21) Appl. No.: 11/261,152

(22) Filed: Oct. 28, 2005

(65) Prior Publication Data

US 2006/0092741 A1 May 4, 2006

(30) Foreign Application Priority Data

Nov. 3, 2004 (KR) .................. 10-2004-008601

(51) Int. Cl.
*G11C 7/00* (2006.01)

(52) U.S. Cl. .................. 365/222; 365/195; 365/233

(58) Field of Classification Search ............ 365/195, 365/222, 233
See application file for complete search history.

(56) References Cited

U.S. PATENT DOCUMENTS 6,567,339 B2   5/2003   Bando ................. 365/233
6,721,223 B2 *  4/2004   Matsumoto et al. ........ 365/222
6,879,536 B2 *  4/2005   Lee ..................... 365/222
2004/0027900 A1   2/2004   Lee ..................... 365/222

FOREIGN PATENT DOCUMENTS

JP   2002-093163      3/2002
KR   10-2003-0009080  1/2003
KR   10-2004-0014838  2/2004

\* cited by examiner

*Primary Examiner*—Hoai V. Ho
(74) *Attorney, Agent, or Firm*—Mills & Onello LLP

(57) ABSTRACT

A self refresh circuit includes a refresh control unit and an internal refresh circuit. The refresh control unit generates a refresh control signal based on a refresh period pulse when a MRS (Mode Set Register) command is deactivated, interrupts an output of the refresh control signal based on a self-refresh-entrance inhibiting signal when the MRS command is deactivated, and generates a refresh command regardless of the refresh period pulse when the MRS command is activated. The MRS command is generated by a combination of at least one address signal and at least one control signal. The internal refresh circuit performs a refresh operation based on the refresh command. Accordingly, access time may be measured correctly and test time may be reduced.

22 Claims, 8 Drawing Sheets

SELF REFRESH CIRCUIT OF PSRAM FOR REAL ACCESS TIME MEASUREMENT AND OPERATING METHOD FOR THE SAME

CROSS-REFERENCE TO RELATED APPLICATIONS

This application relies for priority upon Korean Patent Application No. 2004-88601 filed on Nov. 3, 2004, the contents of which are herein incorporated by reference in their entirety.

BACKGROUND OF THE INVENTION

1. Field of the Invention

The present invention relates to an access time measurement of a Pseudo SRAM (PSRAM), and more particularly, to a self refresh circuit for measuring a real access time of the PSRAM, that is, the access time of a refresh operation that is performed during a memory access operation in the PSRAM.

2. Description of the Related Art

Static Random Access Memory (SRAM) is widely used in the field of high-speed data transmission and mobile devices. Because the price per capacity of SRAM is relatively high, SRAM is inappropriate for large-capacity memory systems. Accordingly, a demand for Pseudo SRAM (PSRAM) is increasing, centering on mobile devices. While PSRAM uses internally dynamic memory cells rather than static cells, it operates much the same like an SRAM.

From a standpoint that the PSRAM device internally employs dynamic memory cells, the PSRAM is also referred to as Uni-transistor RAM (UtRAM). In a Dynamic RAM (DRAM), which uses the dynamic memory cell consisting of a cell capacitor and a cell transistor for switching the cell capacitor, a leakage current may be generated due to the inherent characteristics of the dynamic memory cell. Therefore, written data must be refreshed at regular periodic intervals. Meanwhile, because the PSRAM processes the refresh operation of the DRAM internally, an external circuit such as a memory controller needs not be involved in the refresh operation of the PSRAM device. Thus, the PSRAM can operate much the same as an SRAM.

The PSRAM has advantages in terms of large capacity and low cost. However, compared with the SRAM using the static cell, low power consumption and high operating speed have been raised as important requirements for the PSRAM.

The PSRAM has a lower operation speed than that of the SRAM because it performs the refresh operation internally. Specifically, in the PSRAM, an elapsed time from input of a command to output of data can vary depending on whether a refresh operation is being performed during a read operation or a write operation. For example, access time when the refresh operation is performed during the read operation is longer than an access time when the refresh operation is not performed during the read operation.

FIG. 1 is a block diagram of a conventional self refresh circuit of a PSRAM. The block diagram illustrated in FIG. 1 is an example of the self refresh circuit that can process the internal self refresh of the PSRAM.

Referring to FIG. 1, the conventional refresh circuit 100 includes an internal refresh oscillator 101, a refresh control signal generator 110, a refresh command generator 120, a word line (WL) control pulse generator 130, and an internal refresh circuit 150.

The internal refresh oscillator 101 generates a refresh period pulse SRFH at a constant period according to inherent refresh characteristics of the semiconductor memory device, for example, the refresh period and the refresh cycle. Accordingly, the internal refresh oscillator 101 can be configured with an oscillator and the like.

The refresh control signal generator 110 receives the refresh period pulse SRFH from the internal refresh oscillator 101 and generates a refresh control signal SRFHP. Also, the refresh control signal generator 110 receives a self-refresh-entrance inhibiting signal NERFH from the WL control pulse generator 130. When the self-refresh-entrance inhibiting signal NERFH is activated, entrance into the self refresh operation is interrupted.

Accordingly, based on the self-refresh-entrance inhibiting signal NERFH and the refresh period pulse SRFH, the refresh control signal generator 110 activates the refresh control signal SRFHP to a logic 'LOW' when the refresh period pulse SRFH precedes the self-refresh-entrance inhibiting signal NERFH. When the self-refresh-entrance inhibiting signal NERFH precedes the refresh period pulse SRFH, the refresh control signal generator 110 delays the activation of the refresh control signal SRFHP until the read or write operation is completed.

As described above, the WL control pulse generator 130 generates the self-refresh-entrance inhibiting signal NERFH based on a logical combination of a pulse output from an Address Transition Detector (ATD; not shown) and other signals.

The refresh command generator 120 generates a refresh command pulse RFHTD, which instructs the internal refresh circuit 150 to execute the refresh operation, when the refresh control signal SRFHP is activated.

The internal refresh circuit 150 may include an address counter, a WL selector and other suitable elements for performing the refresh operation. The address counter operates in response to the refresh command pulse RFHTD, and the WL selector selects a word line to be refreshed.

Because the self-refresh-entrance inhibiting signal NERFH and the refresh period pulse SRFH are not synchronized with each other, as described above, priority of the two signals is arbitrary and may vary in different embodiments. Therefore, an elapsed time from the input of a command to the output of data is flexibly changed depending on whether the refresh operation is performed during the read operation or the write operation of the memory cell array.

FIGS. 2A and 2B are timing diagrams illustrating signal flow in the PSRAM.

FIG. 2A is a timing diagram of a signal flow when the refresh operation is not performed during the read operation in the PSRAM.

An ATD pulse PPT is generated at the ATD in response to an external input of an address, and a dummy pulse PUL_RD0 is generated in response to the ATD output pulse PPT.

Referring to FIG. 2A, the output of the refresh control signal SRFHP is delayed because the self-refresh-entrance inhibiting signal NERFH is activated earlier than the refresh period pulse SRFH.

Accordingly, when the ATD again generates an internal ATD signal RATD at a point in time when a section of the dummy pulse PUL_RD0 is finished, the read operation on the memory is immediately performed to output data DOUT.

FIG. 2B is a timing diagram of a signal flow when the refresh operation is performed during the read operation in PSRAM.

The dummy pulse PUL_RD0 is generated in response to the ATD output pulse PPT that is output from the ATD based on the external input of the address as described in FIG. 2A.

Referring to FIG. 2B, the self refresh operation is performed prior to the read operation because the refresh period pulse SRFH is activated earlier than the self-refresh-entrance inhibiting signal NERFH. Namely, the refresh control signal SRFHP is activated by the refresh period pulse SRFH and the refresh command RFHTD is generated by the activation of the refresh control signal SRFHP, so that the internal refresh circuit 150 performs the refresh operation.

Unlike the case of FIG. 2A in which the read operation is performed immediately following with completion of the dummy pulse PUL_RD0, in this case, the read operation is performed when the ATD generates the internal ATD signal RATD again at point in time when the section of the dummy pulse PUL_RD0 is finished and the self refresh operation is completed in FIG. 2B.

As described in FIGS. 2A and 2B, the PSRAM of FIGS. 2A and 2B have different access times for the cases where the refresh operation is not performed during a read operation (FIG. 2A) and where the refresh operation is performed during a read operation (FIG. 2B).

In terms of product specifications such as the AC characteristic that represent the performance of the product, an access time from a column address (hereinafter, referred to as a tAA) in the case where the refresh is involved has significant meaning. The tAA in the case where the refresh is involved is defined as a real tAA. Specifically, in testing the product, the real tAA measurement is important in terms of screening speed.

According to the conventional devices, the greatest tAA, which is measured while a timing of a command is shifted incrementally in the test operation, is considered as the real tAA.

Thus, the real tAA is measured by repeating several times the input of the command and through a trial-and-error method using a skewed timing. This type of measurement is inappropriate for a correct tAA measurement, and also causes time loss in the product test.

SUMMARY OF THE INVENTION

Accordingly, the present invention is provided to substantially obviate one or more problems that arise due to limitations and disadvantages of the related art.

The present invention provides a self refresh circuit, which is capable of correct measurement of the real tAA parameter of the device, reducing loss of time that is incurred for a product test, and initiating the self refresh operation during a memory access operation in a controlled fashion.

Also, the present invention provides a PSRAM having a dynamic memory cell array, which is capable of accurate measurement of real tAA, reducing time loss incurred during a product test, and initiating the self refresh operation during a memory access operation in a controlled fashion.

Further, the present invention provides an operating method of a self refresh circuit, which is capable of accurate measurement of real tAA, reducing time loss incurred during a product test, and initiating the self refresh operation during a memory access operation in a controlled fashion.

In one aspect, the present invention is directed to a self refresh circuit that includes: a refresh control unit configured to generate a refresh control signal based on a refresh period pulse when a MRS (Mode Set Register) command is deactivated, configured to interrupt an output of the refresh control signal based on a self-refresh-entrance inhibiting signal when the MRS command is deactivated, and configured to generate a refresh command regardless of the refresh period pulse when the MRS command is activated, the MRS command being generated by a combination of at least one address signal and at least one control signal; and an internal refresh circuit configured to perform a refresh operation based on the refresh command.

In one embodiment, the self refresh circuit further includes: a refresh oscillator configured to generate the refresh period pulse at a predetermined period; and an MRS unit configured to output the MRS command by combining the at least one address signal and the at least one control signal.

In another embodiment, the refresh control unit further includes: a refresh control signal generator configured to generate the refresh control signal based on the refresh period pulse when the MRS command is deactivated, configured to interrupt the output of the refresh control signal based on the self-refresh-entrance inhibiting signal when the MRS command is deactivated, and configured to disable or enable the refresh control signal regardless of the refresh period pulse in response to the self-refresh-entrance inhibiting signal when the MRS command is activated; a refresh command generation controller configured to generate a refresh command generation control signal based on the self-refresh-entrance inhibiting signal and the MRS command; and a refresh command generator configured to generate the refresh command based on the refresh control signal or the refresh command generation control signal.

In another embodiment, the refresh control signal generator includes: a first inverter configured to invert the refresh period pulse; a first NOR gate configured to receive the MRS command and the inverted refresh period pulse; a falling edge detecting unit configured to detect a falling edge of an output signal of the first NOR gate to generate a pulse having a predetermined pulse width; a second inverter configured to invert the pulse output from the falling edge detecting unit; and a latch configured to receive the inverted pulse as a set signal from the falling edge detecting unit and the self-refresh-entrance inhibiting signal as a reset signal to generate the refresh control signal.

In another embodiment, the falling edge detecting unit includes: an odd number of serially-connected inverters configured to invert the output signal of the first NOR gate; and a second NOR gate configured to receive an output signal of the odd number of the serially-connected inverters and the output signal of the first NOR gate, wherein a pulse width of the pulse output from the falling edge detecting unit is adjusted by propagation delay values of the odd number of the serially-connected inverters.

In another embodiment, the refresh command generation controller includes: an AND operation unit configured to perform an AND operation of the MRS command and the self-refresh-entrance inhibiting signal; and a first inverter configured to invert an output signal of the AND operation unit to output the refresh command generation control signal.

In another embodiment, the AND operation unit includes: a second inverter configured to invert the MRS command; a third inverter configured to invert the self-refresh-entrance inhibiting signal; and a NOR gate configured to perform a NOR operation of the inverted MRS command and the inverted self-refresh-entrance inhibiting signal.

In another embodiment, the refresh command generator includes: a first inverter configured to invert the refresh command generation control signal; a falling edge detecting unit configured to detect a falling edge of the refresh control signal to generate a pulse having a predetermined pulse width; and an OR operation unit configured to perform an OR operation of the inverted refresh command generation control signal and the pulse output from the falling edge detecting unit.

In another embodiment, the falling edge detecting unit includes: an odd number of serially-connected inverters configured to invert the refresh control signal; and a NOR gate configured to receive the inverted refresh control signal and the refresh control signal, wherein a pulse width of the pulse output from the falling edge detecting unit is adjusted by propagation delay values of the odd number of the serially-connected inverters.

In another embodiment, the OR operation unit includes a NOR gate and a second inverter, coupled in series with each other.

In another aspect, the present invention is directed to a PSRAM (Pseudo Static Random Access Memory) that includes: a dynamic memory cell array including a plurality of dynamic memory cells; an access control circuit configured to perform a read operation and a write operation of the dynamic memory cell array based on address signals and control signals, the access control circuit including a word line control pulse generator configured to output a self-refresh-entrance inhibiting signal; and a self refresh circuit configured to perform a refresh operation of the dynamic memory cell array by using a periodic pulse that is generated internally. The self refresh circuit includes: a refresh control unit configured to generate a refresh control signal based on a refresh period pulse when a MRS (Mode Set Register) command is deactivated, configured to interrupt an output of the refresh control signal based on the self-refresh-entrance inhibiting signal when the MRS command is deactivated, and configured to generate a refresh command regardless of the refresh period pulse when the MRS command is activated, the MRS command being generated by a combination of at least one address signal and at least one control signal; and an internal refresh circuit configured to perform a refresh operation based on the refresh command.

In one embodiment, the PSRAM further comprises: a refresh oscillator configured to generate the refresh period pulse at a predetermined period; and an MRS unit configured to output the MRS command by combining the at least one address signal and the at least one control signal.

In another embodiment, the refresh control unit includes: a refresh control signal generator configured to generate the refresh control signal based on the refresh period pulse when the MRS command is deactivated, configured to interrupt the output of the refresh control signal based on the self-refresh-entrance inhibiting signal when the MRS command is deactivated, and configured to disable or enable the refresh control signal regardless of the refresh period pulse in response to the self-refresh-entrance inhibiting signal when the MRS command is activated; a refresh command generation controller configured to generate a refresh command generation control signal based on the self-refresh-entrance inhibiting signal and the MRS command; and a refresh command generator configured to generate the refresh command based on the refresh control signal or the refresh command generation control signal.

In another embodiment, the refresh control signal generator includes: a first inverter configured to invert the refresh period pulse; a first NOR gate configured to receive the MRS command and the inverted refresh period pulse; a falling edge detecting unit configured to detect a falling edge of an output signal of the first NOR gate to generate a pulse having a predetermined pulse width; a second inverter configured to invert the pulse output from the falling edge detecting unit; and a latch configured to receive the inverted pulse from the falling edge detecting unit and the self-refresh-entrance inhibiting signal to generate the refresh control signal.

In another embodiment, the refresh command generation controller includes: an AND operation unit configured to perform an AND operation of the MRS command and the self-refresh-entrance inhibiting signal; and a first inverter configured to invert an output signal of the AND operation unit to output the refresh command generation control signal.

In another embodiment, the refresh command generator includes: a first inverter configured to invert the refresh command generation control signal; a falling edge detecting unit configured to detect a falling edge of the refresh control signal to generate a pulse predetermined pulse width; and an OR operation unit configured to perform an OR operation of the inverted refresh command generation control signal and the pulse output from the falling edge detecting unit.

In another aspect, the present invention is directed to an operating method of a self refresh circuit that includes: generating a refresh control signal based on a refresh period pulse when a MRS (Mode Set Register) command is deactivated, the MRS command being generated by a combination of at least one address signal and at least one control signal; interrupting an output of the refresh control signal based on a self-refresh-entrance inhibiting signal when a MRS command is deactivated; generating a refresh command regardless of the refresh period pulse when the MRS command is activated; and performing a refresh operation based on the refresh command.

In one embodiment, generating a refresh command includes disabling or enabling the refresh control signal regardless of the refresh period pulse in response to the self-refresh-entrance inhibiting signal when the MRS command is activated.

In another embodiment, generating a refresh command includes: generating a refresh command generation control signal based on the self-refresh-entrance inhibiting signal and the MRS command; and generating a refresh command based on the refresh control signal or the refresh command generation control signal.

In another embodiment, generating the refresh control signal includes: performing a NOR operation of the MRS command and an inverted refresh period pulse; detecting a falling edge of a resulting signal of the NOR operation to generate a predetermined pulse; and outputting the refresh control signal that is set by an inversion of the predetermined pulse and is reset by the self-refresh-entrance inhibiting signal.

In another embodiment, generating a refresh command generation control signal includes: performing an AND operation of the MRS command and the self-refresh-entrance inhibiting signal; and inverting a resulting signal of the AND operation to output the refresh command generation control signal.

In another embodiment, generating a refresh command includes: detecting a falling edge of the refresh control signal to generate a predetermined pulse; and performing an OR operation of an inversion of the refresh command generation control signal and the predetermined pulse.

BRIEF DESCRIPTION OF THE DRAWINGS

The above and other advantages of the present invention will become more apparent by describing in detail the example embodiments thereof with reference to the accompanying drawings, in which.

DEATILED DESCRIPTION OF EMBODIMENTS OF THE INVENTION

Hereinafter, the example embodiments of the present invention will be described in detail with reference to the accompanying drawings.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (i.e., "between" versus "directly between", "adjacent" versus "directly adjacent", etc.).

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Figure 3:
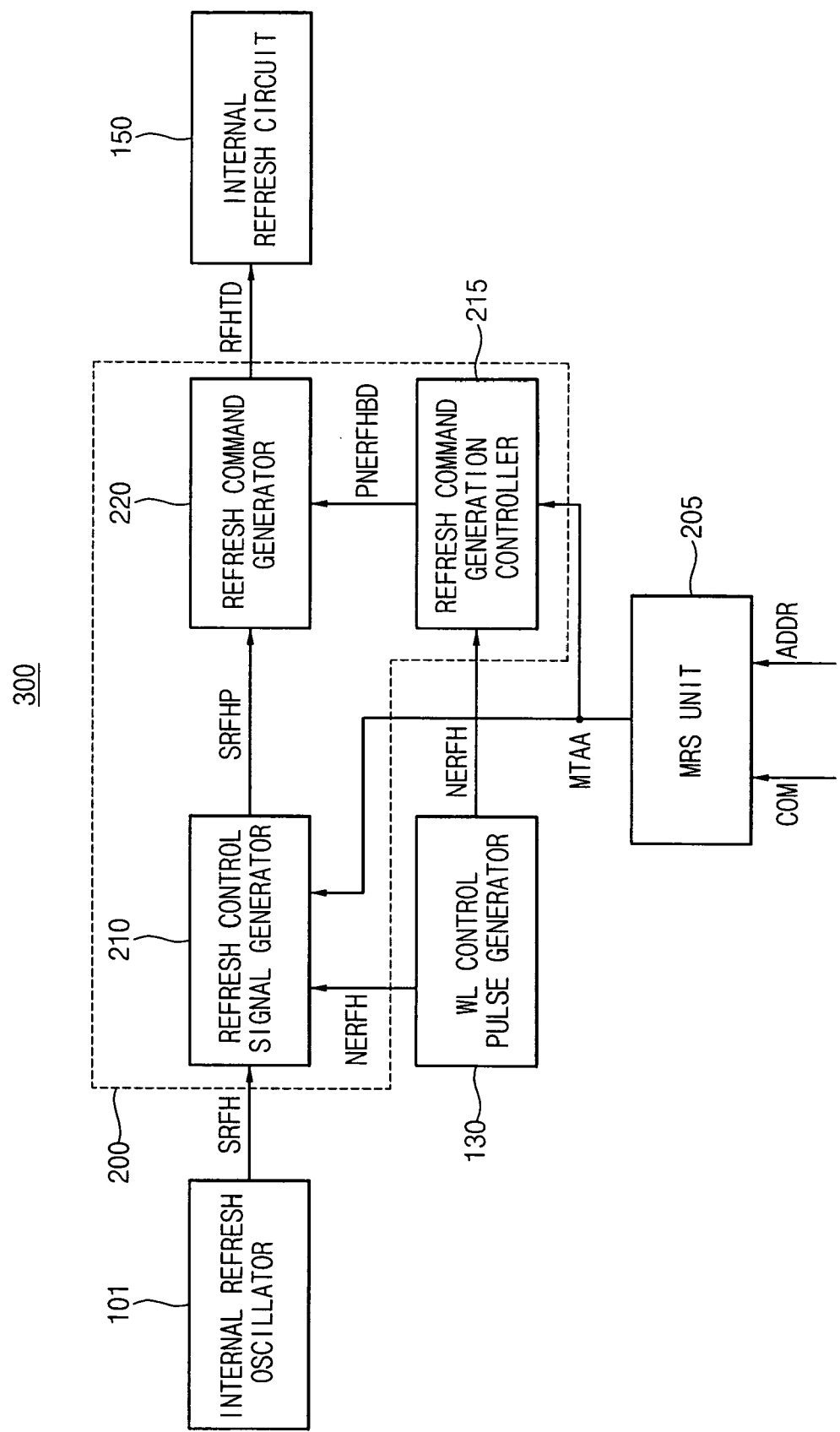
FIG. 3 is a block diagram of a self refresh circuit of a PSRAM according to an example embodiment of the present invention.

FIG. 3 is a block diagram of a self refresh circuit of a PSRAM according to an example embodiment of the present invention.

Referring to FIG. 3, the self refresh circuit 300 includes an internal refresh oscillator 101, a WL control pulse generator 130, an internal refresh circuit 150, an MRS unit 205, and a refresh control unit 200.

Figure 1:
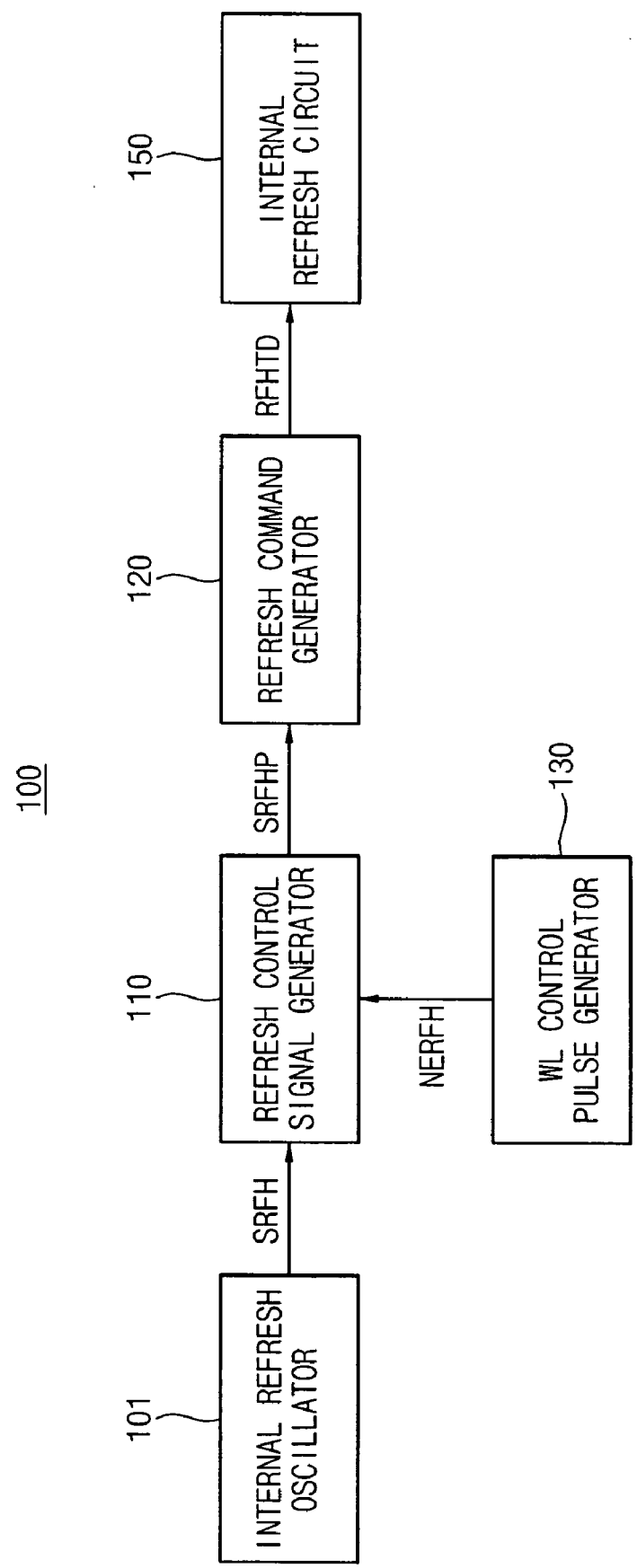
FIG. 1 is a block diagram of a conventional self refresh circuit of a PSRAM.

The functions and structures of the internal refresh oscillator 101, the WL control pulse generator 130, and the internal refresh circuit 150 are similar or substantially similar to those of the conventional self refresh circuit 100 of FIG. 1 and therefore, a detailed description thereof will be omitted.

The refresh control unit 200 includes a refresh control signal generator 210, a refresh command generation controller 215, and a refresh command generator 220.

A real tAA measurement MRS command (hereinafter referred to as an MTAA MRS command), which is defined for the self refresh circuit 300, is generated from the MRS unit 205. The MTAA MRS command is provided to the refresh control signal generator 210 and the refresh command generation controller 215.

The refresh control unit 200 generates a refresh control signal based on a refresh period pulse when a MRS (Mode Set Register) command is deactivated, interrupts an output of the refresh control signal based on a self-refresh-entrance inhibiting signal when the MRS command is deactivated, and generates a refresh command regardless of the refresh period pulse when the MRS command is activated.

The MRS unit 205 generates the MTAA MRS command based on at least one control signal COM and at least one address signal ADDR, which are input to a semiconductor memory device. The MRS unit 205 can include an MRS register and an MRS command decoder.

The refresh control signal generator 210 performs the same operation as the conventional refresh control signal generator 110 in FIG. 1 when the MTAA MRS command is deactivated to a logic 'LOW'. Namely, the refresh control signal generator 210 receives a refresh period pulse SRFH from the internal refresh oscillator 101 and generates a refresh control signal SRFHP. Also, the refresh control signal generator 210 receives a self-refresh-entrance inhibiting signal NERFH from the WL control pulse generator 130. When the self-refresh-entrance inhibiting signal NERFH is activated, the generation of the refresh control signal SRFHP is delayed and thus entrance into the self refresh operation is interrupted.

Accordingly, the refresh control signal generator 210 activates the refresh control signal SRFHP based on the self-refresh-entrance inhibiting signal NERFH and the refresh period pulse SRFH when the refresh period pulse SRFH precedes the self-refresh-entrance inhibiting signal NERFH. When the self-refresh-entrance inhibiting signal NERFH precedes the refresh period pulse SRFH, the refresh control signal generator 210 delays the activation of the refresh control signal SRFHP until the read or write operation of the memory device is completed.

When the MTAA MRS command is activated, the refresh control signal generator 210 locks the output of the refresh control signal SRFHP, regardless of the refresh period pulse SRFH. Accordingly, the activation and deactivation of the refresh control signal SRFHP in response to the refresh period pulse SRFH is disabled.

The above operation of the refresh control signal generator 210 will be described below in more detail.

Figure 4:
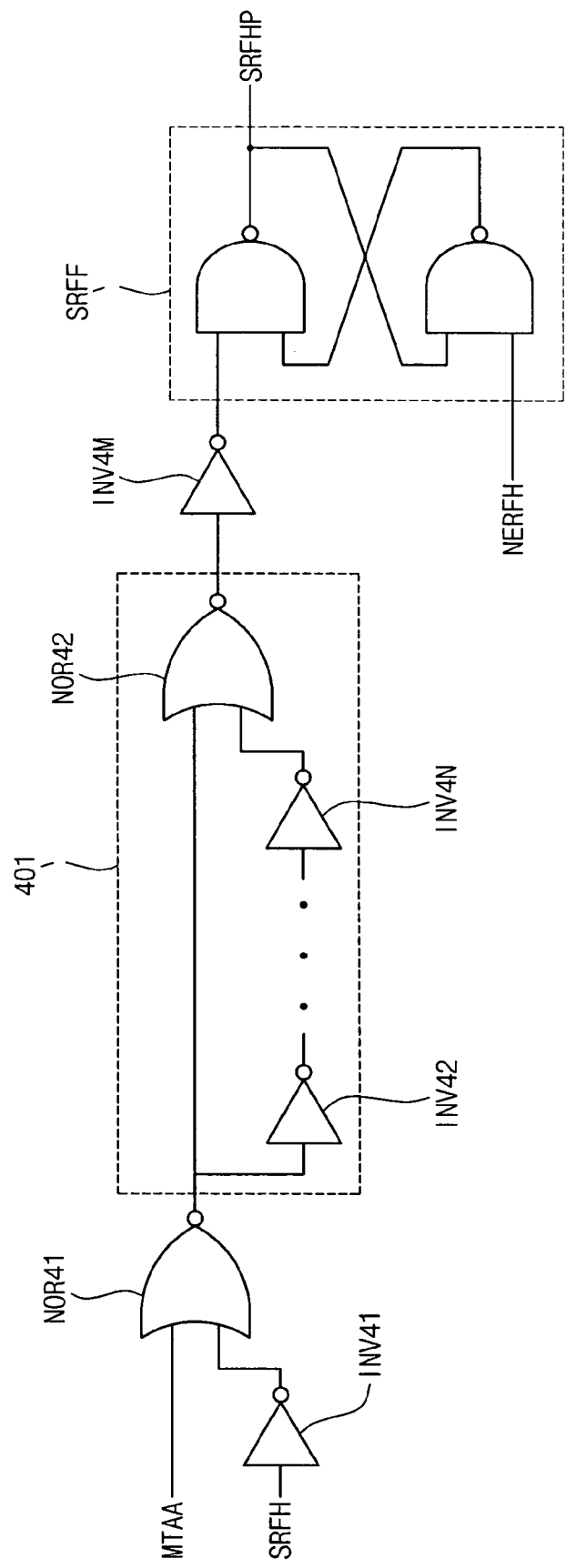
FIG. 4 is a circuit diagram of the refresh control signal generator of FIG. 3.

FIG. 4 is a circuit diagram illustrating the refresh control signal generator 210 of FIG. 3 according to an example embodiment of the present invention.

Referring to FIG. 4, the refresh control signal generator 210 includes an inverter INV41, a NOR gate NOR41, a falling edge detecting unit 401 having an odd number of inverters INV42 to INV4N and a NOR gate NOR42, an inverter INV4M, and an SR latch SRFF having two cross-coupled NAND gates.

The refresh period pulse SRFH output from the internal refresh oscillator 101 is inverted by the inverter INV41, and the MTAA MRS command and the inverted refresh period pulse are input to the NOR gate NOR41.

When the MTAA MRS command is deactivated to a logic 'LOW', the NOR gate NOR41 again inverts the inverted refresh period pulse SRFH (i.e., non-inverted refresh period pulse SRFH). Accordingly, the falling edge detecting unit 401 generates a pulse having a predetermined pulse width at a falling edge of the refresh period pulse SRFH. The pulse width of the pulse is adjusted by a propagation delay of the odd number of the inverters INV42 to INV4N included in the falling edge detecting unit 401.

The pulse output from the falling edge detecting unit 401 is again inverted by the inverter INV4M and input to the SR latch SRFF. The inversed pulse functions to set the refresh control signal SRFHP. The SR latch SRFF receives the self-refresh-entrance inhibiting signal NERFH as a reset signal. While the self-refresh-entrance inhibiting signal NERFH maintains a logic 'HIGH', the time point when the refresh control signal SRFHP is activated to a logic 'LOW' is delayed. That is, the activation of the refresh control signal SRFHP is interrupted by the self-refresh-entrance inhibiting signal NERFH.

The above description pertains to the operation of the refresh control signal generator 210 when the self refresh circuit operates in a normal operating mode.

When the MTAA MRS command is activated to a logic 'HIGH', a self refresh operation during the memory access operation can be initiated in a controlled fashion using the MRS command. The forcible self refresh operation during the memory access is performed for the purpose of the real tAA measurement, which is an object of an example embodiment of the present invention.

When the MTAA MRS command is in the activated state of logic 'HIGH', the output of the NOR gate NOR41 maintains a logic 'LOW'. Therefore, logic level of the output of the falling edge detecting unit 401 is fixed to a logic 'LOW', regardless of the refresh period pulse SRFH output from the refresh oscillator 101.

Figure 5:
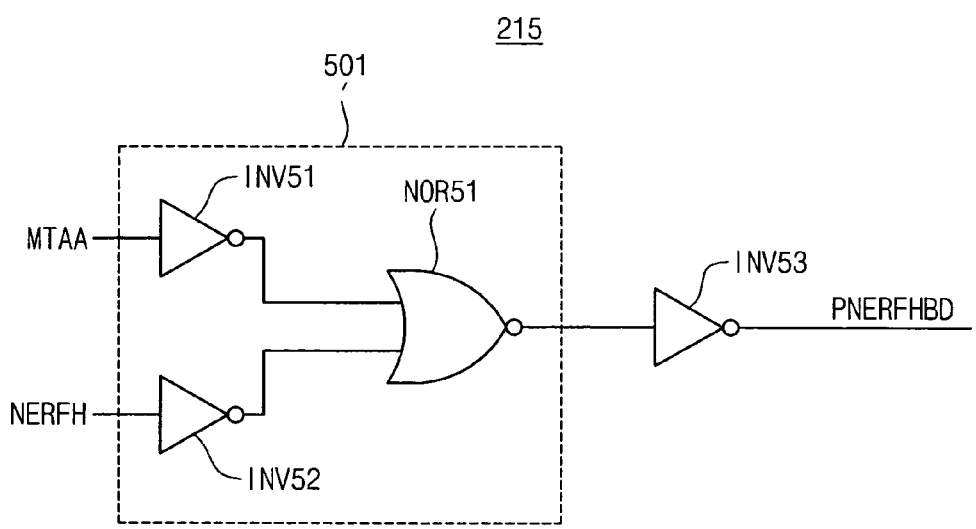
FIG. 5 is a circuit diagram of the refresh command generation controller of FIG. 3.
Figure 6:
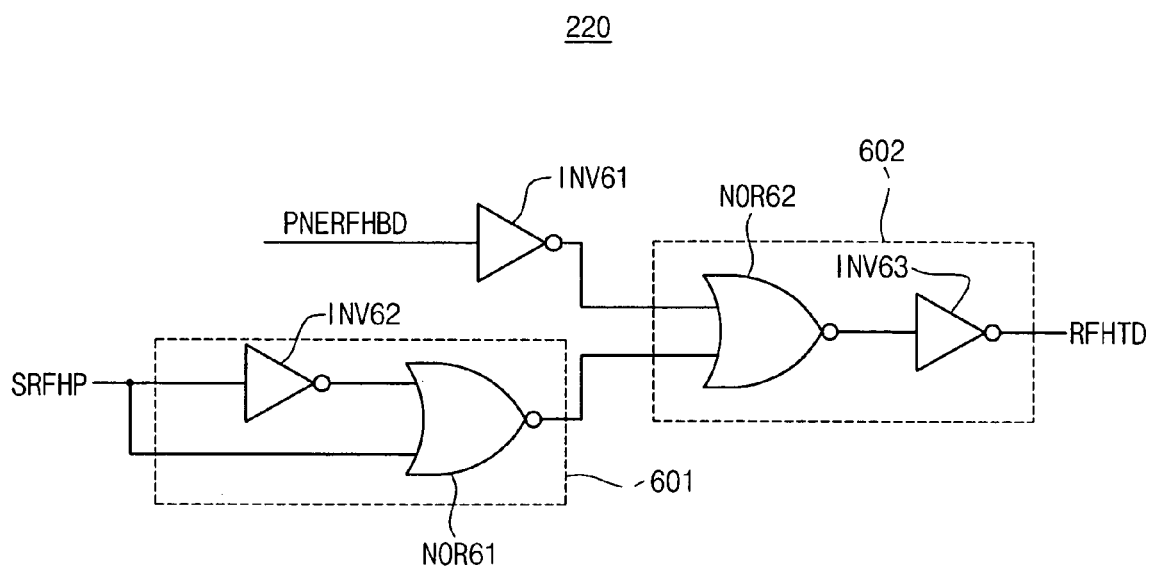
FIG. 6 is a circuit diagram of the refresh command generator of FIG. 3.

When the MTAA MRS command is in the activated state of logic 'HIGH' and the self-refresh-entrance inhibiting signal NERFH (Not Entry Refresh) is in a state of logic 'HIGH', the refresh control signal SRFHP output from the latch SRFF of FIG. 4 is maintained as logic 'HIGH', a refresh command generation control signal PNERFHBD of FIG. 5 is in a logic 'LOW' state, and the refresh command RFHTD having an activated state of logic 'HIGH' is generated through a path comprised of an inverter INV61 and an OR operation unit 602 of FIG. 6.

In addition, when the MTAA MRS command is in the activated state of logic 'HIGH' and the self-refresh-entrance inhibiting signal NERFH is in a state of logic 'LOW', the refresh command RFHTD having an activated state of logic 'HIGH' is generated through a path comprised of a falling edge detecting unit 601 and an OR operation unit 602 of FIG. 6. Particularly, when the MTAA MRS command is in the activated state of logic 'HIGH' and the self-refresh-entrance inhibiting signal NERFH is in a state of logic 'LOW', the refresh control signal SRFHP output from the latch SRFF of FIG. 4 transits from a logic 'HIGH' to a logic 'LOW', the falling edge detecting unit 601 of FIG. 5 detects a falling edge of the refresh control signal SRFHP to output a pulse having a predetermined pulse width, and the OR operation unit 602 of FIG. 6 generates the refresh command RFHTD having an activated state of logic 'HIGH'.

The refresh command RFHTD having an activated state of logic 'HIGH' is thus generated regardless of the refresh period pulse when the MRS command is activated.

The circuit diagram of the refresh control signal generator 210 illustrated in FIG. 4 is given by way of illustration only and it is noted that the number of the inverters may vary and the logic circuits may be implemented in different configurations. In addition, it is apparent to those skilled in the art that the above configuration can be modified depending on timing characteristics of the semiconductor memory device.

The refresh command generation controller 215 of FIG. 5 receives the MTAA MRS command and controls the refresh command generator 220, thereby controlling the generation of the refresh command RFHTD. The refresh command generation controller 215 receives the MTAA MRS command from the MRS unit 205 and the self-refresh-entrance inhibiting signal NERFH from the WL control pulse generator 130 to generate a refresh command generation control signal PNERFHBD. Particularly, the refresh command generation controller 215 can generate the refresh command generation control signal PNERFHBD through an AND operation of the MTAA MRS command and the self-refresh-entrance inhibiting signal NERFH.

Accordingly, when the MTAA MRS command is in the activated state and the self-refresh-entrance inhibiting signal NERFH is in an activated state of logic 'HIGH', the refresh command generation control signal PNERFHBD enables the generation of the refresh command RFHTD having an activated state of logic 'HIGH'.

FIG. 5 is a circuit diagram illustrating the refresh command generation controller 215 of FIG. 3 according to an example embodiment of the present invention.

Referring to FIG. 5, the refresh command generation controller 215 includes an AND operation unit 501 and an inverter INV53. The AND operation unit 501 includes inverters INV51 and INV52 and a NOR gate NOR51.

The input MTAA MRS command is inverted by the inverter INV51 and the self-refresh-entrance inhibiting signal NERFH is inverted by the inverter INV52. The two inverted signals are input to the NOR gate NOR51. Consequently, the inverters INV51 and INV52 and the NOR gate NOR51 that constitute the AND operation unit 501 perform an AND operation of the MTAA MRS command and the self-refresh-entrance inhibiting signal NERFH.

An output of the AND operation unit 501 is inverted by the inverter INV53 and is output as the refresh command generation control signal PNERFHBD.

Therefore, when the MTAA MRS command is in the activated state, the refresh command generation controller 215 provides the refresh command generator 220 with the refresh command generation control signal PNERFHBD that is activated to a logic 'LOW' in synchronization with the self-refresh-entrance inhibiting signal NERFH, so that the generation of the refresh command RFHTD in the refresh command generator 220 is controlled.

The refresh command generator 220 generates the refresh command RFHTD based on the refresh control signal SRFHP output from the refresh control signal generator 210 or the refresh command generation control signal PNERFHBD output from the refresh command generation controller 215.

Namely, the refresh command generator 220 generates the refresh command RFHTD through an OR operation of the refresh control signal SRFHP and the refresh command generation control signal PNERFHBD.

Accordingly, the refresh command generator 220 can perform a normal operation based on the refresh control signal SRFHP, which is generated from the refresh control signal generator 210 in response to the refresh period pulse SRFH, or perform the real tAA measurement operation based on the refresh command generation control signal PNERFHBD, which is generated from the refresh command generation controller 215 in response to the MTAA MRS command.

FIG. 6 is a circuit diagram illustrating the refresh command generator 220 of FIG. 3 according to an example embodiment of the present invention.

Referring to FIG. 6, the refresh command generator 220 includes an inverter INV61, a falling edge detecting unit 601 including an inverter INV62 and a NOR gate NOR61, and an OR operation unit 602 including a NOR gate NOR62 and an inverter INV63.

When the refresh command generation control signal PNERFHBD from the refresh command generation controller 215 is activated to a logic 'LOW', the OR operation unit 602 outputs the refresh command RFHTD having an activated state of logic 'HIGH'.

Similarly, when the MTAA MRS command is in the activated state and the self-refresh-entrance inhibiting signal NERFH is in a state of logic 'LOW', the falling edge detecting unit 601 detects a falling edge of the refresh control signal SRFHP, which is output from the refresh control signal generator 210 to generate a pulse having a predetermined pulse width, and then the OR operation unit 602 outputs the refresh command RFHTD.

Figure 7:
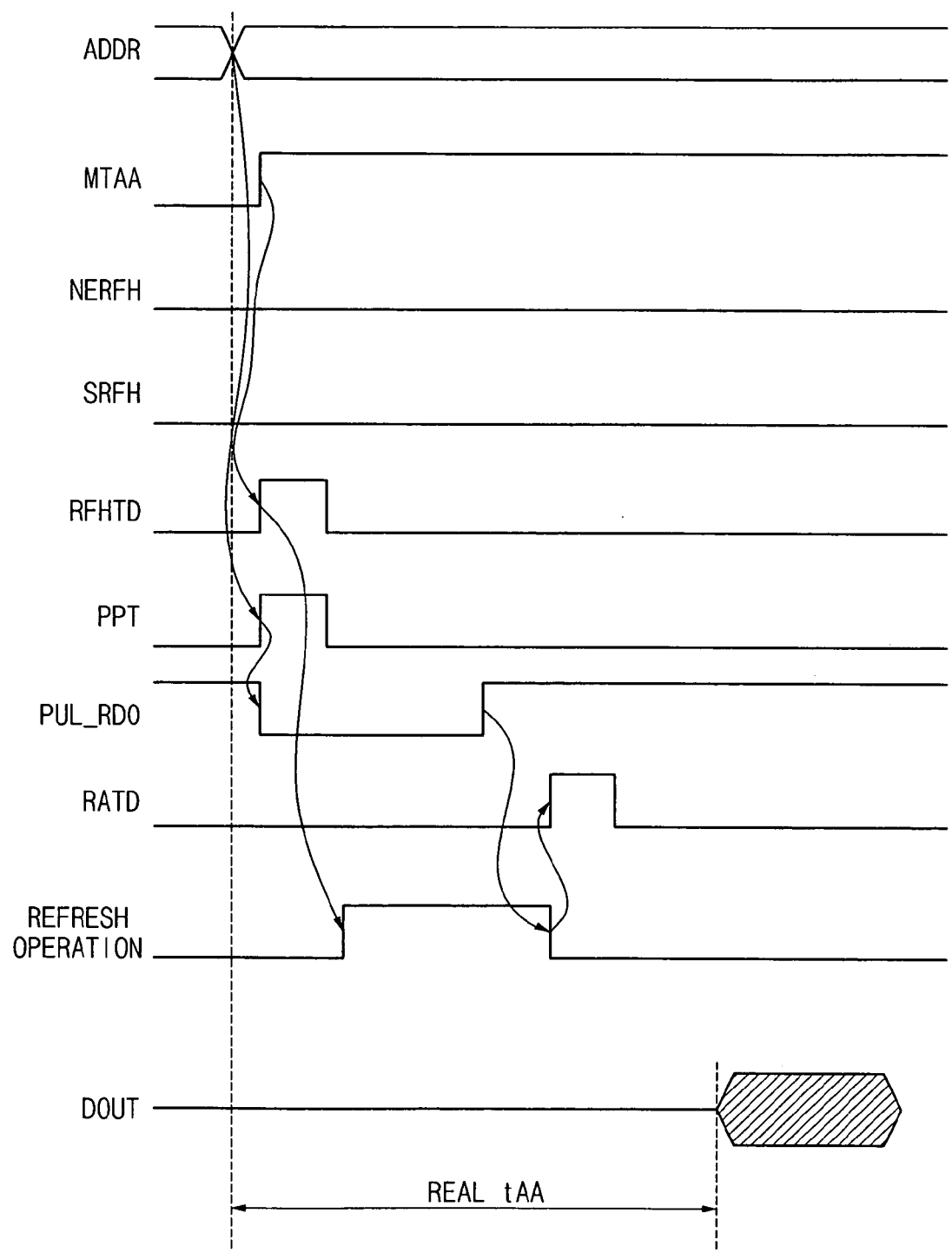
FIG. 7 is a timing diagram of signal flow in a real tAA measurement using the self refresh circuit of FIG. 3.

FIG. 7 is a timing diagram illustrating a signal flow in the real tAA measurement using the self refresh circuit according to an example embodiment of the present invention.

Figure 2A:
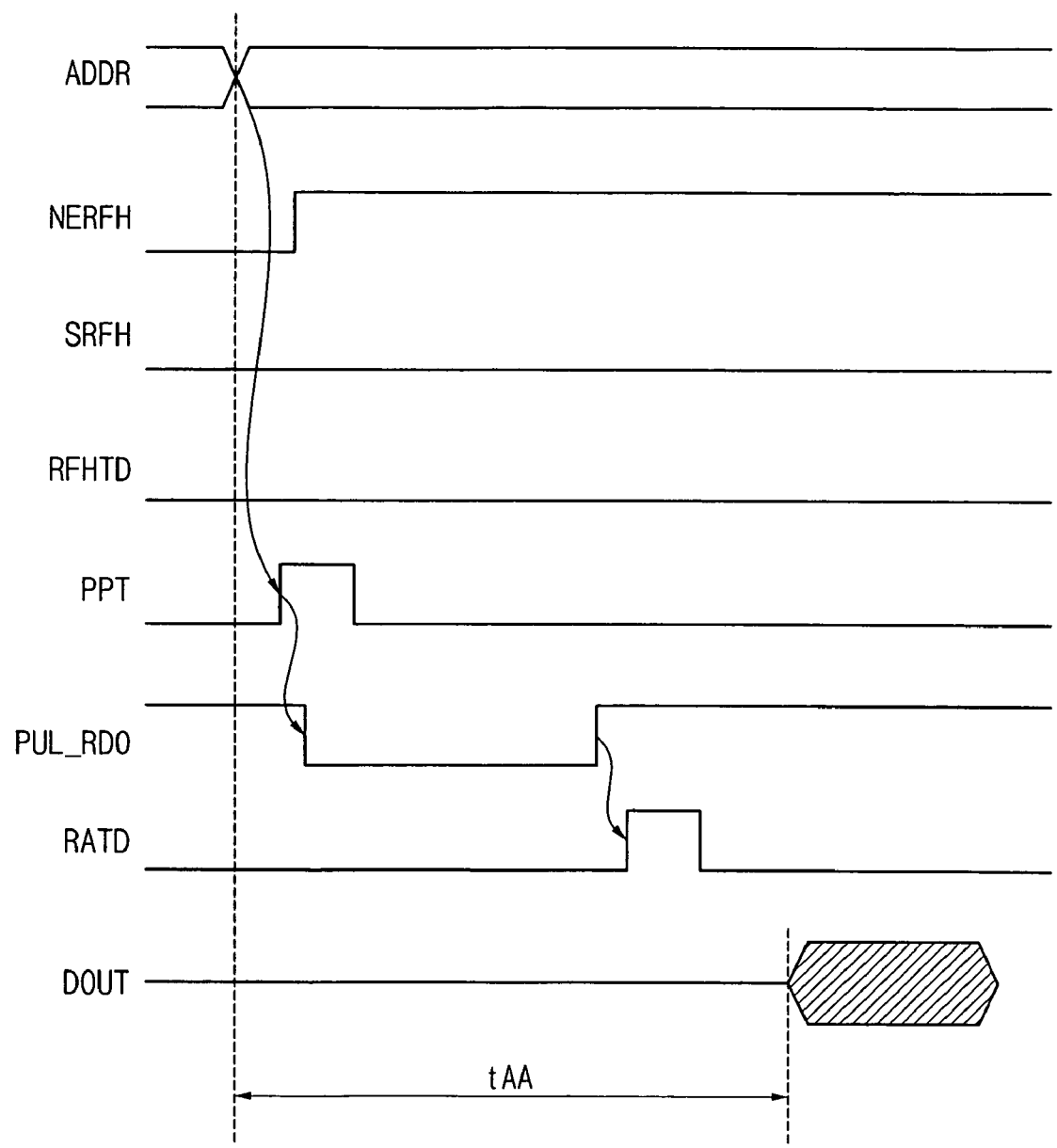
FIG. 2A is a timing diagram of a signal flow when a refresh operation is not performed during a read operation in a PSRAM.
Figure 2B:
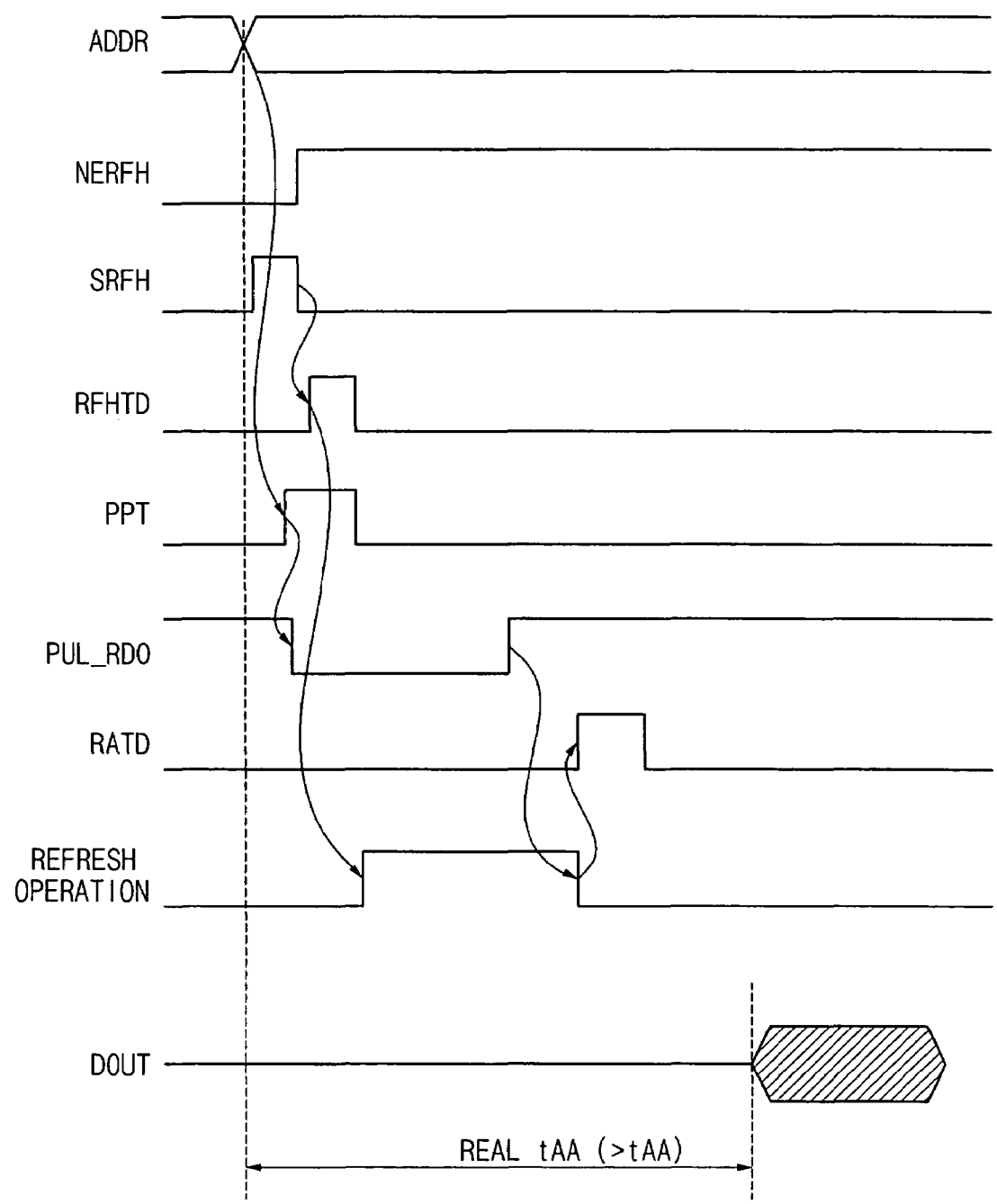
FIG. 2B is a timing diagram of a signal flow when a refresh operation is performed during a read operation in a PSRAM.

The ATD generates the ATD output pulse PTT in response to the input of the external address, and the dummy pulse PUL_RD0 is generated in response to the ATD output pulse PTT, which is described above in connection with the conventional approach with reference to FIGS. 2A and 2B.

Comparing the signals in FIG. 7 with the signals in FIGS. 2A and 2B, the refresh command RFHTD is generated directly by the MTAA MRS command. In FIGS. 2A and 2B, the refresh command RFHTD is generated in response to the refresh period pulse SRFH; however, the refresh command RFHTD in FIG. 7, when the MATT MRS command is activated, is generated directly based on a logic 'HIGH' state or a logic 'LOW' state of the self-refresh-entrance inhibiting signal NERFH through the path comprised of an inverter INV61 and an OR operation unit 602 of FIG. 6 or the path comprised of a falling edge detecting unit 601 and an OR operation unit 602 of FIG. 6.

In this circumstance, the normal read operation is not performed immediately at a time point when the section of the dummy pulse PUL_RD0 is finished, but instead, the read operation is performed when the internal ATD signal RATD is activated after the self refresh operation is completed.

Figure 8:
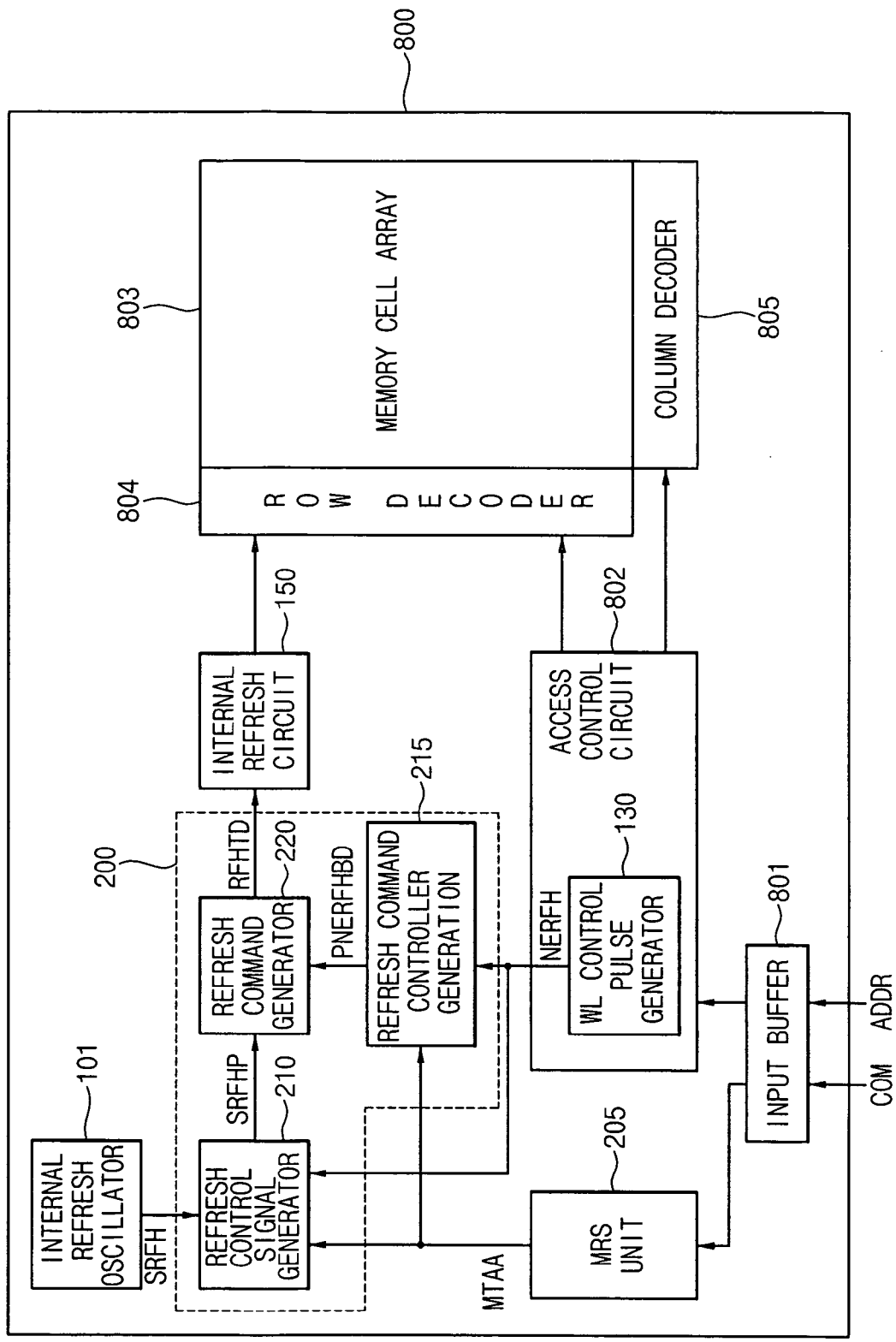
FIG. 8 is a block diagram of a semiconductor memory device that is capable of performing a real tAA measurement using the self refresh circuit of FIG. 3.

FIG. 8 is a block diagram illustrating a semiconductor memory device capable of performing the real tAA measurement using the self refresh circuit of FIG. 3.

Referring to FIG. 8, the semiconductor memory device 800 includes a self refresh circuit having an internal refresh oscillator 101, a WL control pulse generator 130, an internal refresh circuit 150, an MRS unit 205, a refresh control signal generator 210, a refresh command generation controller 215, and a refresh command generator 220.

The semiconductor memory device 800 further includes an input buffer 801, an access control circuit 802, a memory cell array 803, a row decoder 804, and a column decoder 805. The semiconductor memory device 800 in FIG. 8 illustrates portions of the memory device that are relevant to the present invention for illustrative purposes and remaining portions are omitted for the sake of clarity.

The input buffer 801 buffers control signals COM and address signals ADDR, which are respectively input via control signal pads (not shown) and address pads (not shown), and outputs the buffered signals to the MRS unit 205.

The MRS unit 205 includes an MRS register and an MRS command decoder, and outputs the MTAA MRS command to the refresh control signal generator 210 and the refresh command generation controller 215.

The access control circuit 802 performs the read operation and the write operation on the memory cell array 803 based on the control signals COM and the address signals ADDR, which are buffered by the input buffer 801.

The WL control pulse generator 130 included in the access control circuit 802 outputs the self-refresh-entrance inhibiting signal NERFH to the refresh control signal generator 210 and the refresh command generation controller 215 during the read reading operation or the write operation on the memory cell array 803.

As described above, the refresh control signal generator 210 generates the refresh control signal SRFHP based on the refresh period pulse SRFH output from the internal refresh oscillator 101, and interrupts the refresh control signal SRFHP based on the self-refresh-entrance inhibiting signal NERFH. In addition, when the MTAA MRS command is activated, the refresh control signal generator 210 ignores the refresh period pulse SRFH and allows the refresh command RFHTD to have an activated state of logic "HIGH".

Further, as described above, when the MTAA MRS command is activated, the refresh command generation controller 215 provides the refresh command generator 220 with the refresh command generation control signal PNERFHBD synchronized with the self-refresh-entrance inhibiting signal NERFH.

Further, as described above, the refresh command generator 220 generates the refresh command RFHTD to the internal refresh circuit 150 based on the refresh control signal SRFHP or the refresh command generation control signal PNERFHBD, thereby performing the internal refresh operation.

Therefore, the semiconductor memory device 800 can perform the self refresh operation during the normal operation, (i.e., when the MTAA MRS command is deactivated). In addition, when the MTAA MRS command is activated for the real tAA measurement, the semiconductor memory device 800 forces the self refresh operation to be performed during the memory access operation, to perform the real tAA measurement.

In case of the semiconductor memory device that employs the dynamic memory cells and thus requires the self refresh operation, the self refresh operation during the memory access operation can be initiated in a controlled fashion using the MRS command. Therefore, the conventional trial-and-error method of measuring the real access time using the skewed timing may be improved, so that the access time may be measured correctly and the test time may be reduced.

While the present invention has been described with respect to the particular embodiments, it will be apparent to those skilled in the art that various changes and modifications may be made without departing from the spirit and scope of the invention as defined in the following claims.

What is claimed is:

1. A self refresh circuit comprising:
   a refresh control unit configured to generate a refresh control signal based on a refresh period pulse when a MRS(Mode Set Register) command is deactivated, configured to interrupt an output of the refresh control signal based on a self-refresh-entrance inhibiting signal when the MRS command is deactivated, and configured to generate a refresh command regardless of the refresh period pulse when the MRS command is activated, the MRS command being generated by a combination of at least one address signal and at least one control signal; and
   an internal refresh circuit configured to perform a refresh operation based on the refresh command.

2. The self refresh circuit of claim 1, further comprising:
   a refresh oscillator configured to generate the refresh period pulse at a predetermined period; and
   an MRS unit configured to output the MRS command by combining the at least one address signal and the at least one control signal.

3. The self refresh circuit of claim 2, wherein the refresh control unit includes:
   a refresh control signal generator configured to generate the refresh control signal based on the refresh period pulse when the MRS command is deactivated, configured to interrupt the output of the refresh control signal based on the self-refresh-entrance inhibiting signal when the MRS command is deactivated, and configured to disable or enable the refresh control signal regardless of the refresh period pulse in response to the self-refresh-entrance inhibiting signal when the MRS command is activated;
   a refresh command generation controller configured to generate a refresh command generation control signal based on the self-refresh-entrance inhibiting signal and the MRS command; and
   a refresh command generator configured to generate the refresh command based on the refresh control signal or the refresh command generation control signal.

4. The self refresh circuit of claim 3, wherein the refresh control signal generator includes:
   a first inverter configured to invert the refresh period pulse;
   a first NOR gate configured to receive the MRS command and the inverted refresh period pulse;
   a falling edge detecting unit configured to detect a falling edge of an output signal of the first NOR gate to generate a pulse having a predetermined pulse width;
   a second inverter configured to invert the pulse output from the falling edge detecting unit; and
   a latch configured to receive the inverted pulse as a set signal from the falling edge detecting unit and the self-refresh-entrance inhibiting signal as a reset signal to generate the refresh control signal.

5. The self refresh circuit of claim 4, wherein the falling edge detecting unit includes:
   an odd number of serially-connected inverters configured to invert the output signal of the first NOR gate; and
   a second NOR gate configured to receive an output signal of the odd number of the serially-connected inverters and the output signal of the first NOR gate, wherein a pulse width of the pulse output from the falling edge detecting unit is adjusted by propagation delay values of the odd number of the serially-connected inverters.

6. The self refresh circuit of claim 3, wherein the refresh command generation controller includes:
   an AND operation unit configured to perform an AND operation of the MRS command and the self-refresh-entrance inhibiting signal; and
   a first inverter configured to invert an output signal of the AND operation unit to output the refresh command generation control signal.

7. The self refresh circuit of claim 6, wherein the AND operation unit includes:
   a second inverter configured to invert the MRS command;
   a third inverter configured to invert the self-refresh-entrance inhibiting signal; and
   a NOR gate configured to perform a NOR operation of the inverted MRS command and the inverted self-refresh-entrance inhibiting signal.

8. The self refresh circuit of claim 3, wherein the refresh command generator includes:
   a first inverter configured to invert the refresh command generation control signal;
   a falling edge detecting unit configured to detect a falling edge of the refresh control signal to generate a pulse having a predetermined pulse width; and
   an OR operation unit configured to perform an OR operation of the inverted refresh command generation control signal and the pulse output from the falling edge detecting unit.

9. The self refresh circuit of claim 7, wherein the falling edge detecting unit includes:
   an odd number of serially-connected inverters configured to invert the refresh control signal; and
   a NOR gate configured to receive the inverted refresh control signal and the refresh control signal,
   wherein a pulse width of the pulse output from the falling edge detecting unit is adjusted by propagation delay values of the odd number of the serially-connected inverters.

10. The self refresh circuit of claim 8, wherein the OR operation unit includes a NOR gate and a second inverter, coupled in series with each other.

11. A PSRAM (Pseudo Static Random Access Memory), comprising:
    a dynamic memory cell array including a plurality of dynamic memory cells;
    an access control circuit configured to perform a read operation and a write operation of the dynamic memory cell array based on address signals and control signals, the access control circuit including a word line control pulse generator configured to output a self-refresh-entrance inhibiting signal; and
    a self refresh circuit configured to perform a refresh operation of the dynamic memory cell array by using a periodic pulse that is generated internally,
    wherein the self refresh circuit includes:
    a refresh control unit configured to generate a refresh control signal based on a refresh period pulse when a MRS (Mode Set Register) command is deactivated, configured to interrupt an output of the refresh control signal based on the self-refresh-entrance inhibiting signal when the MRS command is deactivated, and configured to generate a refresh command regardless of the refresh period pulse when the MRS command is activated, the MRS command being generated by a combination of at least one address signal and at least one control signal; and
    an internal refresh circuit configured to perform a refresh operation based on the refresh command.

12. The PSRAM of claim 1, further comprising:
a refresh oscillator configured to generate the refresh period pulse at a predetermined period; and
an MRS unit configured to output the MRS command by combining the at least one address signal and the at least one control signal.

13. The PSRAM of claim 2, wherein the refresh control unit includes:
a refresh control signal generator configured to generate the refresh control signal based on the refresh period pulse when the MRS command is deactivated, configured to interrupt the output of the refresh control signal based on the self-refresh-entrance inhibiting signal when the MRS command is deactivated, and configured to disable or enable the refresh control signal regardless of the refresh period pulse in response to the self-refresh-entrance inhibiting signal when the MRS command is activated;
a refresh command generation controller configured to generate a refresh command generation control signal based on the self-refresh-entrance inhibiting signal and the MRS command; and
a refresh command generator configured to generate the refresh command based on the refresh control signal or the refresh command generation control signal.

14. The PSRAM of claim 13, wherein the refresh control signal generator includes:
a first inverter configured to invert the refresh period pulse;
a first NOR gate configured to receive the MRS command and the inverted refresh period pulse;
a falling edge detecting unit configured to detect a falling edge of an output signal of the first NOR gate to generate a pulse having a predetermined pulse width;
a second inverter configured to invert the pulse output from the falling edge detecting unit; and
a latch configured to receive the inverted pulse from the falling edge detecting unit and the self-refresh-entrance inhibiting signal to generate the refresh control signal.

15. The PSRAM of claim 13, wherein the refresh command generation controller includes:
an AND operation unit configured to perform an AND operation of the MRS command and the self-refresh-entrance inhibiting signal; and
a first inverter configured to invert an output signal of the AND operation unit to output the refresh command generation control signal.

16. The PSRAM of claim 13, wherein the refresh command generator includes:
a first inverter configured to invert the refresh command generation control signal;
a falling edge detecting unit configured to detect a falling edge of the refresh control signal to generate a pulse predetermined pulse width; and
an OR operation unit configured to perform an OR operation of the inverted refresh command generation control signal and the pulse output from the falling edge detecting unit.

17. An operating method of a self refresh circuit, comprising:
generating a refresh control signal based on a refresh period pulse when a MRS (Mode Set Register) command is deactivated, the MRS command being generated by a combination of at least one address signal and at least one control signal;
interrupting an output of the refresh control signal based on a self-refresh-entrance inhibiting signal when the MRS command is deactivated;
generating a refresh command regardless of the refresh period pulse when the MRS command is activated; and
performing a refresh operation based on the refresh command.

18. The operating method of claim 17, wherein generating a refresh command includes disabling or enabling the refresh control signal regardless of the refresh period pulse in response to the self-refresh-entrance inhibiting signal when the MRS command is activated.

19. The operating method of claim 18, wherein generating a refresh command includes:
generating a refresh command generation control signal based on the self-refresh-entrance inhibiting signal and the MRS command; and
generating a refresh command based on the refresh control signal or the refresh command generation control signal.

20. The operating method of claim 19, wherein generating the refresh control signal includes:
performing a NOR operation of the MRS command and an inverted refresh period pulse;
detecting a falling edge of a resulting signal of the NOR operation to generate a predetermined pulse; and
outputting the refresh control signal that is set by an inversion of the predetermined pulse and is reset by the self-refresh-entrance inhibiting signal.

21. The operating method of claim 19, wherein generating a refresh command generation control signal includes:
performing an AND operation of the MRS command and the self-refresh-entrance inhibiting signal; and
inverting a resulting signal of the AND operation to output the refresh command generation control signal.

22. The operating method of claim 19, wherein generating a refresh command includes:
detecting a falling edge of the refresh control signal to generate a predetermined pulse; and
performing an OR operation of an inversion of the refresh command generation control signal and the predetermined pulse.

* * * * *

UNITED STATES PATENT AND TRADEMARK OFFICE
CERTIFICATE OF CORRECTION

PATENT NO.         : 7,187,609 B2                                    Page 1 of 1
APPLICATION NO.    : 11/261152
DATED              : March 6, 2007
INVENTOR(S)        : Soo-Young Kim et al.

It is certified that error appears in the above-identified patent and that said Letters Patent is hereby corrected as shown below:

On the title page Item [56]
    In the Foreign Application Priority Data Section, delete "10-2004-008601" and insert --10-2004-0088601--

Signed and Sealed this

Seventeenth Day of July, 2007

JON W. DUDAS
*Director of the United States Patent and Trademark Office*